United States Patent
Hsieh et al.

(10) Patent No.: US 8,164,913 B2
(45) Date of Patent: Apr. 24, 2012

(54) FASTENER AND ELECTRONIC DEVICE HAVING THE SAME

(75) Inventors: Ming-Chih Hsieh, Taipei Hsien (TW); Tsung-Hsi Li, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 218 days.

(21) Appl. No.: 12/761,337

(22) Filed: Apr. 15, 2010

(65) Prior Publication Data

US 2011/0194264 A1 Aug. 11, 2011

(30) Foreign Application Priority Data

Feb. 8, 2010 (TW) .................................. 99103737

(51) Int. Cl.
*H05K 7/12* (2006.01)
(52) U.S. Cl. ........ 361/758; 361/742; 361/804; 361/770; 174/138 E
(58) Field of Classification Search .................. 361/742, 361/770, 758, 804, 807, 809; 174/138 G, 174/138 E
See application file for complete search history.

(56) References Cited

U.S. PATENT DOCUMENTS

| 4,760,495 | A | * | 7/1988 | Till ................................. 361/804 |
| 5,917,709 | A | * | 6/1999 | Johnson et al. ................ 361/803 |
| 6,366,465 | B1 | * | 4/2002 | Baur et al. ...................... 361/752 |
| 6,493,233 | B1 | * | 12/2002 | De Lorenzo et al. ........... 361/752 |
| 7,593,239 | B2 | * | 9/2009 | Li et al. ........................... 361/807 |

* cited by examiner

*Primary Examiner* — Dameon Levi
(74) *Attorney, Agent, or Firm* — Altis Law Group, Inc.

(57) ABSTRACT

A fastener includes a cylinder and a draw hook. The cylinder includes a main body, two resilient arms extending from an end of the main body, and a flange extending from a circumference of an opposite end of the main body. A number of protrusions spaced in the axial direction of the main body extends from an inside surface of each of the resilient arms. The draw hook includes a post slidably received in the cylinder, a taper-shaped engaging portion extending from an end of the post and exposed out of distal ends of the resilient arms, and a handle extending from an opposite end of the post. A diameter of the engaging portion gradually grows larger along a direction away from the post.

10 Claims, 3 Drawing Sheets

FASTENER AND ELECTRONIC DEVICE HAVING THE SAME

BACKGROUND

1. Technical Field

The present disclosure relates generally to a fastener, and an electronic device having the fastener

2. Description of Related Art

Generally, an electronic device, such as a server or a computer, includes a chassis having two opposite fixing slots. A circuit board is fixed to the chassis by being directly inserted into the fixing slots. However, the circuit board is fixed precariously to the chassis and is apt to be damaged.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
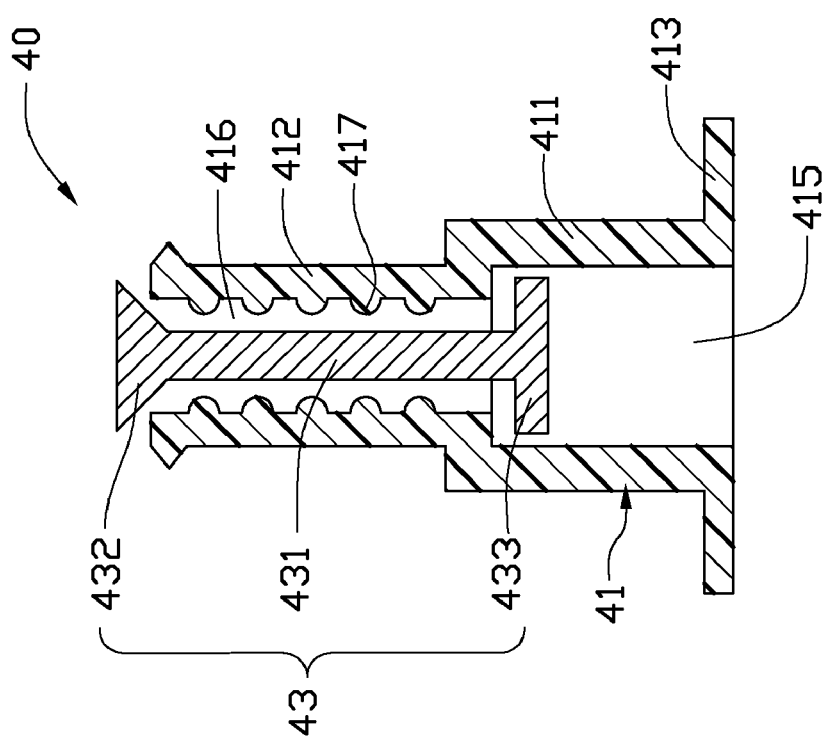
FIG. 1 is a cross-section view of an exemplary embodiment of a fastener.
Figure 2:
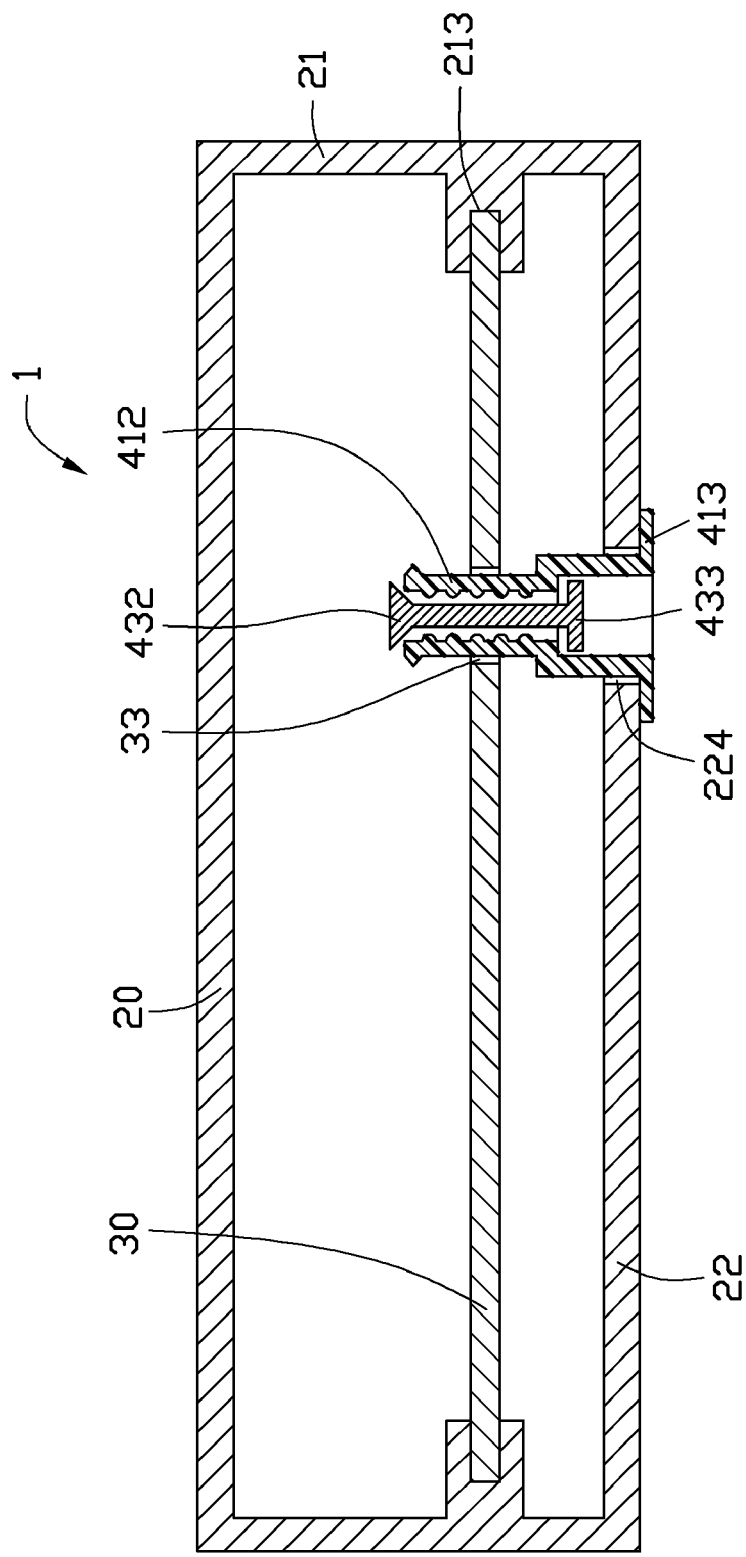
FIGS. 2 and 3 are cross-section views of an exemplary embodiment of an electronic device having the fastener of FIG. 1, showing different states of the fastener.

Referring to FIGS. 1 and 2, an exemplary embodiment of an electronic device 1 includes a chassis 20, a circuit board 30 defining a bore 33, and a fastener 40.

The chassis 20 includes two opposite sidewalls 21, and an end wall 22 perpendicularly connected between the sidewalls 21. A fixing slot 213 is defined in an inner side of each sidewall 21. The fixing slots 213 of the sidewalls 21 are aligned with each other, and are parallel to the end wall 22. A through hole 224 is defined in the end wall 22.

The fastener 40 includes a cylinder 41, and a draw hook 43 slidably coupled to the cylinder 41. The cylinder 41 includes a cylindrical main body 411, two opposite resilient arms 412 extending from an end of the main body 411, and a flange 413 perpendicularly extending from a circumference of an opposite end of the main body 411. A receiving space 415 is defined in the main body 411 extending along an axial direction of the main body 411. A slot 416 is defined between the resilient arms 412 in communication with the receiving space 415 of the main body 411. A width of the slot 416 is less than a diameter of the receiving space 415. A plurality of semicolumnar protrusions 417 spaced in the axial direction of the main body 411 extend from an inside surface of each resilient arm 412. The draw hook 43 includes a post 431, a taper-shaped engaging portion 432 extending from an end of the post 431, and an elongated handle 433 perpendicularly extending from an opposite end of the post 431. A diameter of the engaging portion 432 gradually grows larger along a direction away from the post 431. A length of the handle 433 is less than the diameter of the receiving space 415, and greater than the width of the slot 416 between the resilient arms 412. In an original state, the handle 433 of the draw hook 43 is received in the receiving space 415 of the main body 411 of the cylinder 41. The post 431 is received in the receiving space 415 and the slot 416 between the resilient arms 412, and the engaging portion 432 is exposed out of distal ends of the resilient arms 412 through the slot 416.

Figure 3:
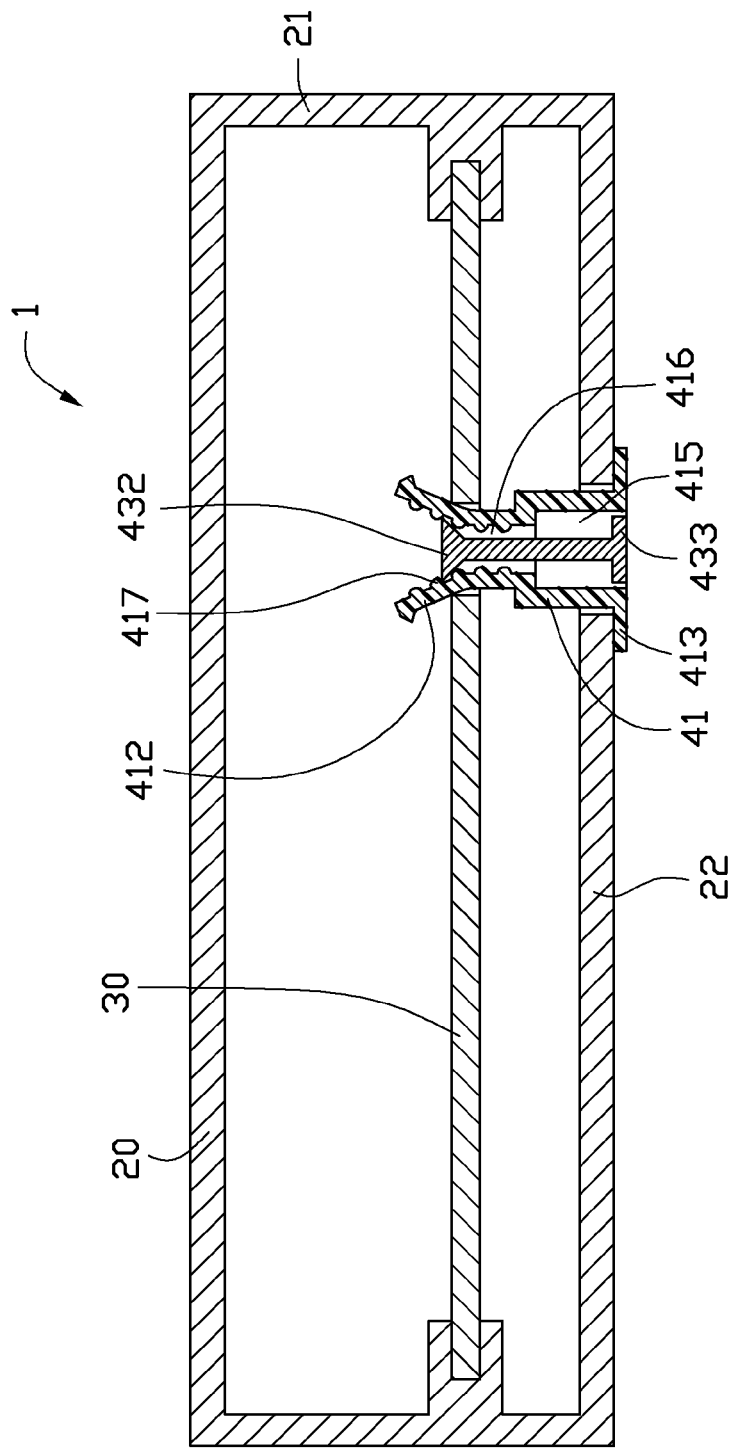

Referring to FIG. 3, in assembly, opposite ends of the circuit board 30 are correspondingly inserted into the fixing slots 213 of the chassis 20, allowing the circuit board 30 to be parallelly spaced from the end wall 22 of the chassis 20, and allowing the bore 33 of the circuit board 30 to align with the through hole 224 of the end wall 22. The fastener 40 is inserted into the chassis 20 through the through hole 224 of the end wall 22, until the flange 413 of the cylinder 41 of the fastener 40 abuts against an outer side of the end wall 22. The engaging portion 432 of the draw hook 43 and the distal ends of the resilient arms 412 of the cylinder 41 extend through the bore 33 of the circuit board 30. The handle 433 of the draw hook 43 is pulled outward from the receiving space 415 of the cylinder 41 manually. In this process, the engaging portion 432 of the draw hook 43 gradually inserts into the slot 416 and deforms the resilient arms 412 outwardly, to engage with different protrusions 417 of the resilient arms 412, until outside surfaces of the resilient arms 412 correspondingly abut against portions of the circuit board 30 bounding the bore 33. The engaging portion 432 of the draw hook 43 is positioned between two corresponding pairs of protrusions 417 of the resilient arms 412. Thereby, the draw hook 43 is locked to the cylinder 41, and the circuit board 30 is locked to the chassis 20 with the resilient arms 412

To detach the circuit board 30, the handle 433 of the draw hook 43 is pushed inwardly, to allow the engaging portion 432 to disengage from the corresponding pairs of protrusions 417 of the resilient arms 412 and gradually exit out of the slot 416 between the resilient arms 412. The resilient arms 412 are restored and disengage from the circuit board 30. The flange 413 of the fastener 40 is pulled outwardly, to allow the fastener 40 to exit out of the chassis 20. Thereby, the circuit board 30 is unlocked from the chassis 20, and easily detached from the chassis 20.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A fastener, comprising:
    a cylinder comprising a main body, two resilient arms extending from an end of the main body, and a flange extending from a circumference of an opposite end of the main body, wherein a receiving space is defined in the main body extending along an axial direction of the main body, a slot is defined between the resilient arms in communication with the receiving space, a plurality of protrusions spaced in the axial direction of the main body extends from an inside surface of each of the resilient arms; and
    a draw hook comprising a post slidably received in the receiving space and the slot of the cylinder, a taper-shaped engaging portion extending from an end of the post and exposed out of distal ends of the resilient arms through the slot, and a handle extending from an opposite end of the post and received in the receiving space, wherein a diameter of the engaging portion gradually grows larger along a direction away from the post.

2. The fastener of claim 1, wherein each of the plurality of protrusions is semicolumnar.

3. The fastener of claim 1, wherein a width of the slot between the resilient arms is less than a diameter of the receiving space of the main body.

4. The fastener of claim 3, wherein the handle is perpendicular to the post, a length of the handle is less than the diameter of the receiving space, and greater than the width of the slot.

5. An electronic device, comprising:
a chassis comprising an end wall, a through hole defined in the end wall;
a circuit board installed in the chassis parallelly spaced from the end wall, a bore defined in the circuit board aligning with the through hole of the end wall; and
a fastener comprising a cylinder extending through the through hole of the end wall of the chassis, and a draw hook, the cylinder comprising a flange abutting against an outer side of the end wall, and two resilient arms extending through the bore of the circuit board, a plurality of protrusions spaced in an axial direction of the cylinder extending from an inside surface of each of the resilient arms, the draw hook comprising a post slidably received in the cylinder, a taper-shaped engaging portion extending from an end of the post and exposed out of distal ends of the resilient arms, and a handle extending from an opposite end of the post, a diameter of the engaging portion gradually growing larger along a direction away from the post, wherein when the handle of the draw hook is pulled out from the cylinder, the engaging portion of the draw hook deforms the resilient arms outwardly to allow the resilient arms to abut against portions of the circuit board bounding the bore, the engaging portion engages with corresponding protrusions of the resilient arms.

6. The electronic device of claim 5, wherein a receiving space is defined in a middle of the cylinder extending along the axial direction of the cylinder, a slot is defined between the resilient arms in communication with the receiving space, the post of the draw hook is slidably received in the receiving space and the slot, and the handle is received in the receiving space.

7. The electronic device of claim 6, wherein a width of the slot between the resilient arms is less than a diameter of the receiving space.

8. The electronic device of claim 7, wherein the handle is perpendicular to the post, a length of the handle is less than the diameter of the receiving space, and greater than the width of the slot.

9. The electronic device of claim 5, wherein each of the plurality of protrusions is semicolumnar.

10. The electronic device of claim 5, wherein the chassis further comprises two opposite sidewalls perpendicular to the end wall, a fixing slot is defined in an inner side of each sidewall, opposite ends of the circuit board are correspondingly inserted into the fixing slots of the sidewalls.

\* \* \* \* \*